(12) United States Patent
Fung et al.

(10) Patent No.: US 12,733,293 B2
(45) Date of Patent: Sep. 8, 2026

(54) OUTPUT CIRCUIT FOR SPAD

(71) Applicant: Samsung Electronics Co., Ltd., Suwon-si (KR)

(72) Inventors: Tze Ching Fung, Diamond Bar, CA (US); Yibing Michelle Wang, Temple City, CA (US); Hongyu Wang, South Pasadena, CA (US); Eunchul Kang, South Pasadena, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 368 days.

(21) Appl. No.: 18/477,480

(22) Filed: Sep. 28, 2023

(65) Prior Publication Data

US 2024/0322051 A1 Sep. 26, 2024

Related U.S. Application Data

(60) Provisional application No. 63/454,567, filed on Mar. 24, 2023.

(51) Int. Cl.

| | |
|---|---|
| ***H10F 77/00*** | (2025.01) |
| ***H10F 30/225*** | (2025.01) |
| ***H10F 39/00*** | (2025.01) |
| ***H10F 39/18*** | (2025.01) |

(52) U.S. Cl.

CPC ......... *H10F 77/959* (2025.01); *H10F 30/225* (2025.01); *H10F 39/18* (2025.01); *H10F 39/8037* (2025.01); *H10F 39/811* (2025.01)

(58) Field of Classification Search

CPC ...... H10F 77/959; H10F 30/225; H10F 39/18; H10F 39/8037; H10F 39/811; G01J 1/44; G01J 2001/442; G01J 2001/4466; G01J 2001/4473; G01S 7/4861

See application file for complete search history.

(56) References Cited

U.S. PATENT DOCUMENTS

| | | | | |
|---|---|---|---|---|
| 5,512,854 | A | 4/1996 | Park | |
| 10,321,080 | B2 | 6/2019 | Kim et al. | |
| 10,527,728 | B2 | 1/2020 | Wang | |
| 10,785,437 | B2 * | 9/2020 | Prathipati | H04N 25/63 |

(Continued)

FOREIGN PATENT DOCUMENTS

| | | | |
|---|---|---|---|
| CN | 106338339 | B | 11/2017 |
| CN | 106657826 | B | 8/2019 |
| WO | WO 2022/201797 | A1 | 9/2022 |

OTHER PUBLICATIONS

Henderson, R. K. et al., "A 3x3, 5μm pitch, 3-transistor Single Photon Avalanche Diode Array with Integrated 11V Bias Generation in 90nm CMOS Technology", 2010, pp. 14.2.1-14.2.4, IEEE.

*Primary Examiner* — Jonathan Han

(74) *Attorney, Agent, or Firm* — Womble Bond Dickinson (US) LLP

(57) ABSTRACT

An output circuit for a single-photon avalanche diode. In some embodiments, a system includes: a first sensing element; a bus line; a first pull-down circuit; a first pull-up element; and a second pull-up element, the first pull-up element, the second pull-up element, and the first pull-down circuit being connected to the bus line, the first pull-down circuit being connected to the first sensing element and configured to be activated based on a signal from the first sensing element, the first pull-up element having a lower drive strength than the first pull-down circuit.

18 Claims, 11 Drawing Sheets

(56) References Cited

U.S. PATENT DOCUMENTS

| | | | | |
|---|---|---|---|---|
| 10,788,363 | B2 | 9/2020 | Fujimoto | |
| 11,031,511 | B2 * | 6/2021 | Stark | H10F 77/959 |
| 11,137,285 | B2 | 10/2021 | Dutton | |
| 2022/0102404 | A1 | 3/2022 | Lee et al. | |
| 2023/0217136 | A1 * | 7/2023 | Van Der Tempel | H04N 25/626 250/378 |

* cited by examiner

| Un-Compensated | | | | | | | | |
|---|---|---|---|---|---|---|---|---|
| Location | D0 | D1 | D2 | D3 | D4 | D5 | D6 | D7 |
| Left | 0 | 0 | 1 | 1 | 1 | 1 | 0 | 0 |
| Center | 0 | 0 | 1 | 1 | 1 | 1 | 0 | 0 |
| Right | 0 | 0 | 1 | 1 | 1 | 1 | 0 | 0 |

FIG. 3B

| Delay Compensated | | | | | | | | |
|---|---|---|---|---|---|---|---|---|
| Location | D0 | D1 | D2 | D3 | D4 | D5 | D6 | D7 |
| Left | 0 | 0 | 0 | 1 | 1 | 1 | 1 | 0 |
| Center | 0 | 0 | 1 | 1 | 1 | 1 | 0 | 0 |
| Right | 0 | 1 | 1 | 1 | 1 | 0 | 0 | 0 |

FIG. 3C

OUTPUT CIRCUIT FOR SPAD

CROSS-REFERENCE TO RELATED APPLICATION(S)

The present application claims priority to and the benefit of U.S. Provisional Application No. 63/454,567, filed Mar. 24, 2023, entitled "DIGITAL OUTPUT BUS ARCHITECTURE FOR SPAD ARRAY", the entire content of which is incorporated herein by reference.

FIELD

One or more aspects of embodiments according to the present disclosure relate to photodetectors, and more particularly to an output circuit for a single-photon avalanche diode (SPAD) in an array of single-photon avalanche diodes.

BACKGROUND

Single-photon avalanche diode photodetectors have various applications, including in light detection and ranging (Lidar) systems, and in fluorescence lifetime microscopy. In an array of single-photon avalanche diodes, provisions may be made to read out the signals from the single-photon avalanche diodes using one or more shared readout buses.

It is with respect to this general technical environment that aspects of the present disclosure are related.

SUMMARY

According to an embodiment of the present disclosure, there is provided a system, including: a first sensing element; a bus line; a first pull-down circuit; a first pull-up element; and a second pull-up element, the first pull-up element, the second pull-up element, and the first pull-down circuit being connected to the bus line, the first pull-down circuit being connected to the first sensing element and configured to be activated based on a signal from the first sensing element, the first pull-up element having a lower drive strength than the first pull-down circuit.

In some embodiments, the first sensing element is a single-photon avalanche diode.

In some embodiments, the system includes: a plurality of sensing elements including the first sensing element; and a plurality of pull-down circuits including the first pull-down circuit, each of the pull-down circuits being connected to the bus line, each of the pull-down circuits being connected to, and configured to be activated based on a signal from, a respective sensing element of the plurality of sensing elements, wherein the sensing elements and the pull-down circuits share the bus line and the first pull-up element.

In some embodiments, first the first pull-down circuit includes a pull-down transistor.

In some embodiments, the first pull-down circuit further includes a row-select transistor.

In some embodiments, the row-select transistor is connected between the pull-down transistor and the bus line.

In some embodiments, the first pull-up element and the second pull-up element together have a lower drive strength than the first pull-down circuit.

In some embodiments: the first pull-up element has a drive strength less than one-half of a drive strength of the first pull-down circuit, and the second pull-up element has a drive strength less than one-half of a drive strength of the first pull-down circuit.

In some embodiments, the system further includes a buffer amplifier connected to the bus line.

In some embodiments, the buffer amplifier is connected to and end of the bus line.

In some embodiments, the buffer amplifier includes a complementary metal oxide semiconductor (CMOS) inverter.

In some embodiments, the buffer amplifier includes three CMOS inverters.

In some embodiments, the system further includes a bias circuit for applying a bias voltage to the first sensing element, the magnitude of the bias voltage being greater than 2.0 V.

In some embodiments, the magnitude of a voltage drop across the first pull-up element, when the bus line is pulled down by the first pull-down circuit, is less than 1.5 V.

In some embodiments, the first pull-up element includes a transistor having a gate connected to a fixed voltage.

In some embodiments, the system includes: a plurality of pull-up elements including the first pull-up element and the second pull-up element, and a processing circuit, configured to turn on or off each of the pull-up elements according to a location of a pixel being read out.

In some embodiments, the system includes: a plurality of pull-up elements including the first pull-up element and the second pull-up element; and a pixel surveying circuit configured to detect faulty pixels, and to turn off the pull-up elements when a faulty pixel is being read out.

According to an embodiment of the present disclosure, there is provided a method, including: pulling up, by a first pull-up element and a second pull-up element, a bus line; detecting, by a sensing element, a photon; and causing, by the sensing element, a pull-down circuit to pull down the bus line, the first pull-up element having a lower drive strength than the pull-down circuit.

In some embodiments, the pull-down circuit includes a pull-down transistor.

According to an embodiment of the present disclosure, there is provided a system, including: a means for sensing; a bus line; a first pull-down circuit; a first pull-up element; and a second pull-up element, the first pull-up element, the second pull-up element, and the first pull-down circuit being connected to the bus line, the first pull-down circuit being connected to the means for sensing and configured to be activated based on a signal from the means for sensing, the first pull-up element having a lower drive strength than the first pull-down circuit.

BRIEF DESCRIPTION OF THE DRAWINGS

These and other features and advantages of the present disclosure will be appreciated and understood with reference to the specification, claims, and appended drawings wherein:

FIG. 3B is a table of transistor control signal values, according to an embodiment of the present disclosure;

FIG. 3C is a table of transistor control signal values, according to an embodiment of the present disclosure;

DETAILED DESCRIPTION

The detailed description set forth below in connection with the appended drawings is intended as a description of exemplary embodiments of an output circuit for a single-photon avalanche diode (SPAD) in an array of single-photon avalanche diodes provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Figure 1:
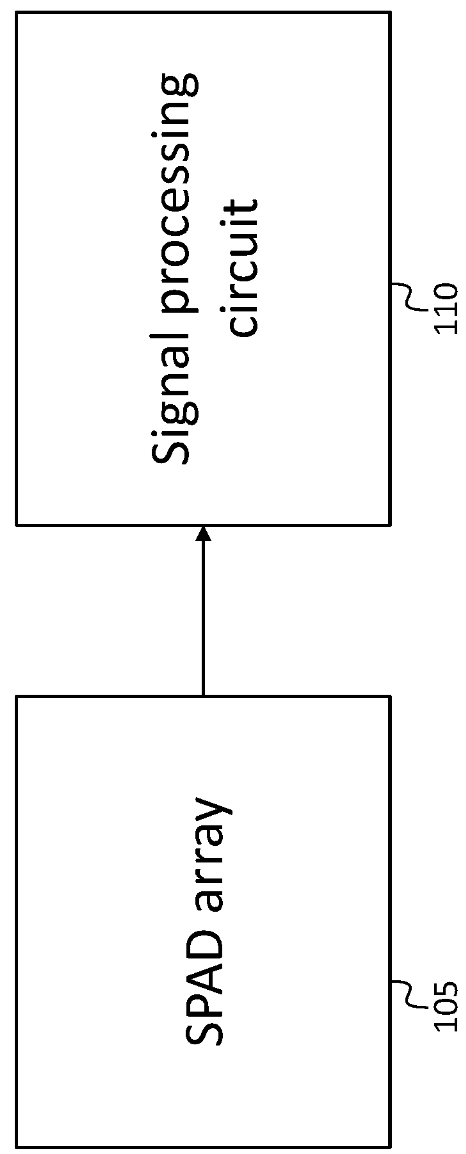
FIG. 1 is a system diagram, according to an embodiment of the present disclosure.

FIG. 1 is a system diagram showing a single-photon avalanche diode array detector 105 and a signal processing circuit 110 connected to the single-photon avalanche diode array detector. Such a detector may be used, for example, as part of a light detection and ranging (Lidar) system. The single-photon avalanche diode array may be a rectangular (e.g., square) array of pixels, each pixel including a single-photon avalanche diode and an associated circuit. Each single-photon avalanche diode may generate an electrical pulse each time it absorbs a photon. The circuit associated with a single-photon avalanche diode in the single-photon avalanche diode array may, for example, condition these pulses and amplify the pulses for transmission, on a bus line (which may be a conductor extending across the array), to an edge of the array. At the edge of the array (e.g., at the ends of the bus lines) the signals may be further conditioned or amplified and sent to the signal processing circuit, where, for example, photon counting or time of flight measurements may be performed.

Different kinds of image sensors may have different circuits. For example, a complementary metal oxide semiconductor (CMOS) array detector (or image sensor) may include, at each pixel, a source follower circuit, which serves as a buffer for reading out analog signals from a photodiode in the pixel. The output swing of the source follower circuit may be limited, and the source follower circuit may be inherently unsuited for the output signal from a single-photon avalanche diode, which may consist of high-rate digital pulses.

A single-photon avalanche diode may have a digital readout circuit that utilizes an inverter at the output node of each pixel to drive the pixel output bus. In such a circuit, the inverter may be relatively large, in order to have sufficient signal drive strength to drive the bus line across the entire array; this may result in a large pixel size.

As mentioned above, multiple pixels of a single-photon avalanche diode array may share (e.g., be connected to) the same pixel output bus line. In such a configuration, to provide isolation between pixels, each pixel output stage may be converted to dynamic logic (enabling only one pixel to drive the bus line at a time) or each pixel output stage may include an additional pass-gate (or "row-select" transistor). Either of these approaches may consume more pixel area, and, e.g., increase the size of the pixel.

A single-photon avalanche diode and the digital periphery circuit may operate at two different power bias levels (VDD), and include additional level shifters to convert the signal levels. This also may consume additional chip area and result in additional power consumption.

Figure 2A:
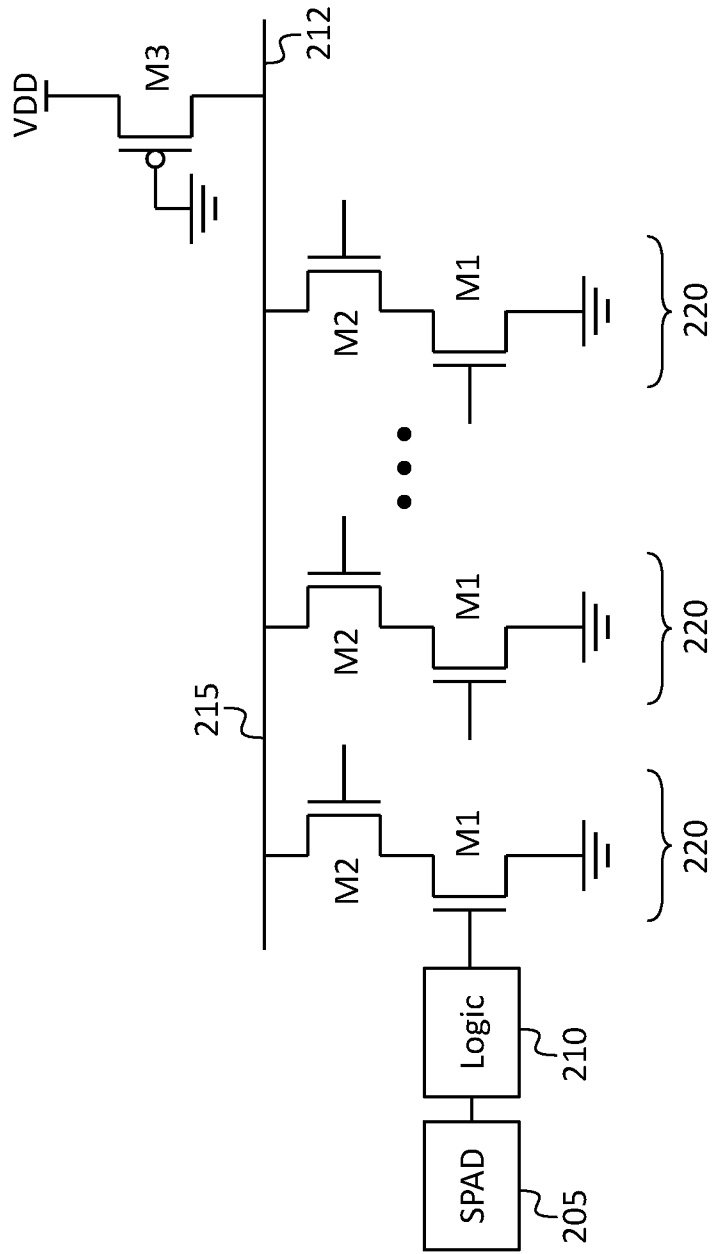
FIG. 2A is a diagram of a portion of a single-photon avalanche diode array detector, according to an embodiment of the present disclosure.

As, such, in some embodiments, an output circuit such as that illustrated in FIG. 2A may be employed in a single-photon avalanche diode array. Each pixel of the array may include a single-photon avalanche diode 205 connected to a logic circuit 210 including one or more logic gates, which may convert the short analog pulse produced by the single-photon avalanche diode upon absorption of a photon to a digital pulse. An output 212 of the circuit may be connected to the signal processing circuit 110 (FIG. 1).

As illustrated in FIG. 2A, the pixel circuit may be connected to the bus line 215 through a pixel enable, or "row-select" transistor M2. In such an embodiment, the bus line 215 may be shared by all of the pixels in a column of the single-photon avalanche diode array, and the rows may be selected one at a time by respective row-select signals (e.g., by setting each of a plurality of row-select lines to logic high, one at a time, to turn on a corresponding set of row-select transistors M2, one in each column of the single-photon avalanche diode array). When a pixel in a column is selected, the row-select transistor M2 of the pixel may be turned on, connecting the other elements of the pixel to the bus line 215 for the column; the remaining row-select transistors M2 may be turned off, isolating the other pixels from the bus line 215. The logic circuit 210 may drive a pull-down element (e.g., a pull-down transistor M1), which, together with the row-select transistor M2, may form a pull-down circuit 220. When a photon is absorbed by the single-photon avalanche diode and the pull-down transistor M1 is turned on, the voltage level on bus line 215 is pulled down to ground, as a result of current flowing to ground through the row-select transistor M2 and the pull-down transistor M1.

The voltage level on bus line 215 may be pulled up to supply voltage (VDD) by a pull-up element (e.g., a pull-up transistor M3, as illustrated). The pull-up transistor M3 may be a p-channel metal oxide semiconductor field effect transistor (a p-channel MOSFET) as shown, with the source connected to a positive supply voltage (VDD, e.g., 1.2 V), the gate connected to ground, and the drain connected to the bus line 215. The pull-up transistor M3 may have a lower drive strength (e.g., current drive strength) than the pull-down circuit 220, e.g., it may have a lower drive strength (e.g., current drive strength) than each of (i) the row-select transistor M2 and (ii) the pull-down transistor M1. As such, when the pull-down circuit 220 is turned on, it may be able to pull the bus line 215 down to ground or to near ground, in spite of the flow of current to the bus line 215 through the pull-up transistor M3. A plurality of pixels (each including a single-photon avalanche diode 205, a logic circuit 210, and a pull-down circuit 220) may share the bus line 215 and the pull-up transistor M3 (for ease of illustration, the single-photon avalanche diodes 205, and the logic circuits 210 are omitted from FIG. 2A, for all except the left-most pixel in FIG. 2A). The row-select transistor M2 and the pull-down transistor M1 may be sized so as to provide an acceptably short fall time at the output 212 (e.g., at the "downstream end" of the bus line 215).

Figure 2B:
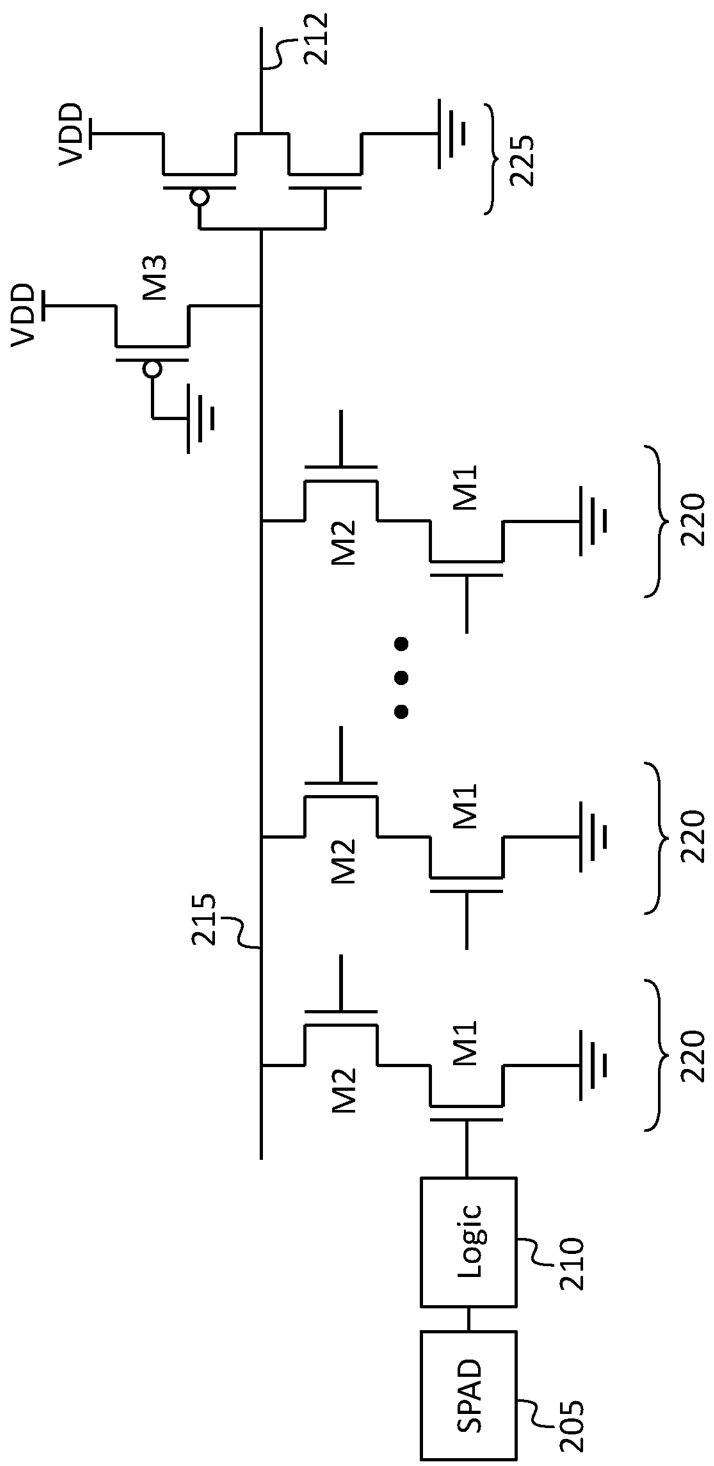
FIG. 2B is a diagram of a portion of a single-photon avalanche diode array detector, according to an embodiment of the present disclosure.

Referring to FIG. 2B, in some embodiments, a buffer amplifier is connected to the end of the bus line 215, to shorten the rising edge and the falling edge of each pulse corresponding to the absorption of a photon by the single-photon avalanche diode 205. The buffer amplifier may also reduce the extent to which loading of the output 212 by the circuit it drives (e.g., loading of the output 212 by the signal processing circuit 110) may lengthen the rising edge and the falling edge of each pulse corresponding to the absorption of a photon by the single-photon avalanche diode 205. The buffer amplifier may be an inverting amplifier, e.g., it may be or include a complementary metal oxide semiconductor (CMOS) inverter 225, as shown.

Figure 2C:
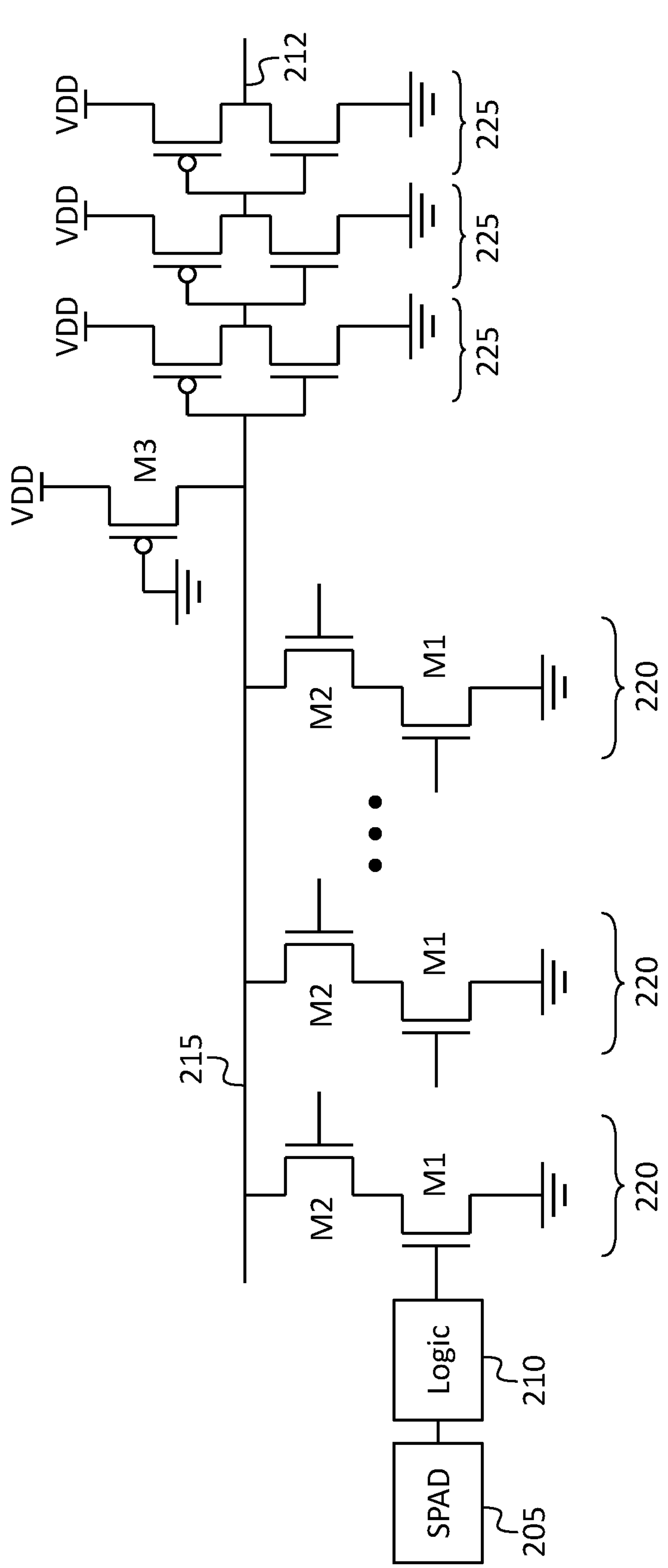
FIG. 2C is a diagram of a portion of a single-photon avalanche diode array detector, according to an embodiment of the present disclosure.

Referring to FIG. 2C, in some embodiments, the buffer amplifier includes three CMOS inverters 225 connected in cascade, to further shorten (e.g., sharpen) the rising edge and the falling edge of each pulse corresponding to the absorption of a photon by the single-photon avalanche diode 205, and to further reduce the extent to which loading of the output 212 by the circuit it drives (e.g., loading of the output 212 by the signal processing circuit 110) may lengthen the rising edge and the falling edge of each pulse.

Figure 2D:
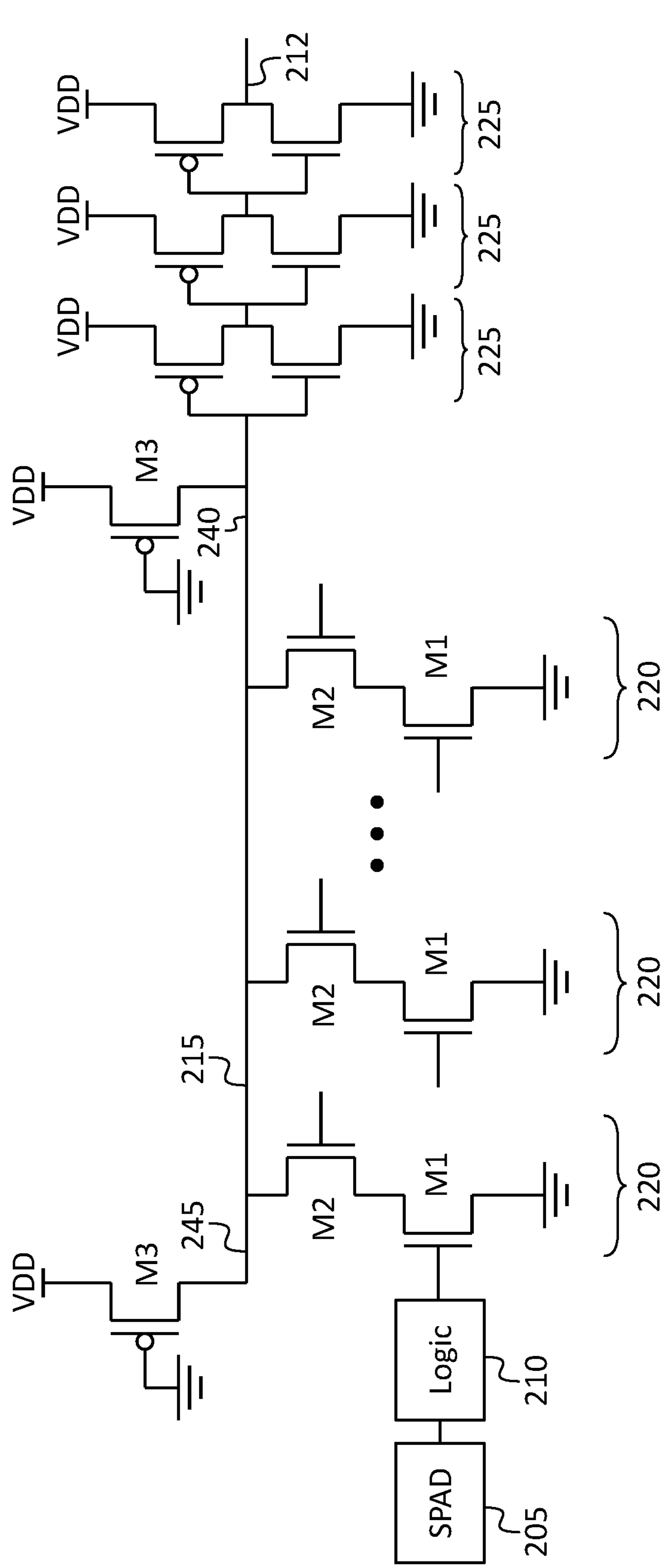
FIG. 2D is a diagram of a portion of a single-photon avalanche diode array detector, according to an embodiment of the present disclosure.

Referring to FIG. 2D, in some embodiments, more than one pull-up transistor M3 may be present on the bus line 215, e.g., one pull-up transistor M3 may be present at the downstream end 240 of the bus line 215, and another pull-up transistor M3 may be present at the upstream end 245 of the bus line 215, as illustrated. In such an embodiment, the two pull-up transistors M3 may, together, have a lower drive strength than the pull-down circuit 220. For example each of the two pull-up transistors M3 may have a drive strength of less than one-half of the drive strength of the pull-down circuit 220, or one of the two pull-up transistors M3 may have a drive strength of more than one-half of the drive strength of the pull-down circuit 220 and the other one of the two pull-up transistors M3 may have a drive strength of less than one-half of the drive strength of the pull-down circuit 220, with the total drive strength of the two pull-up transistors M3 being less than the drive strength of the pull-down circuit 220.

Figure 2E:
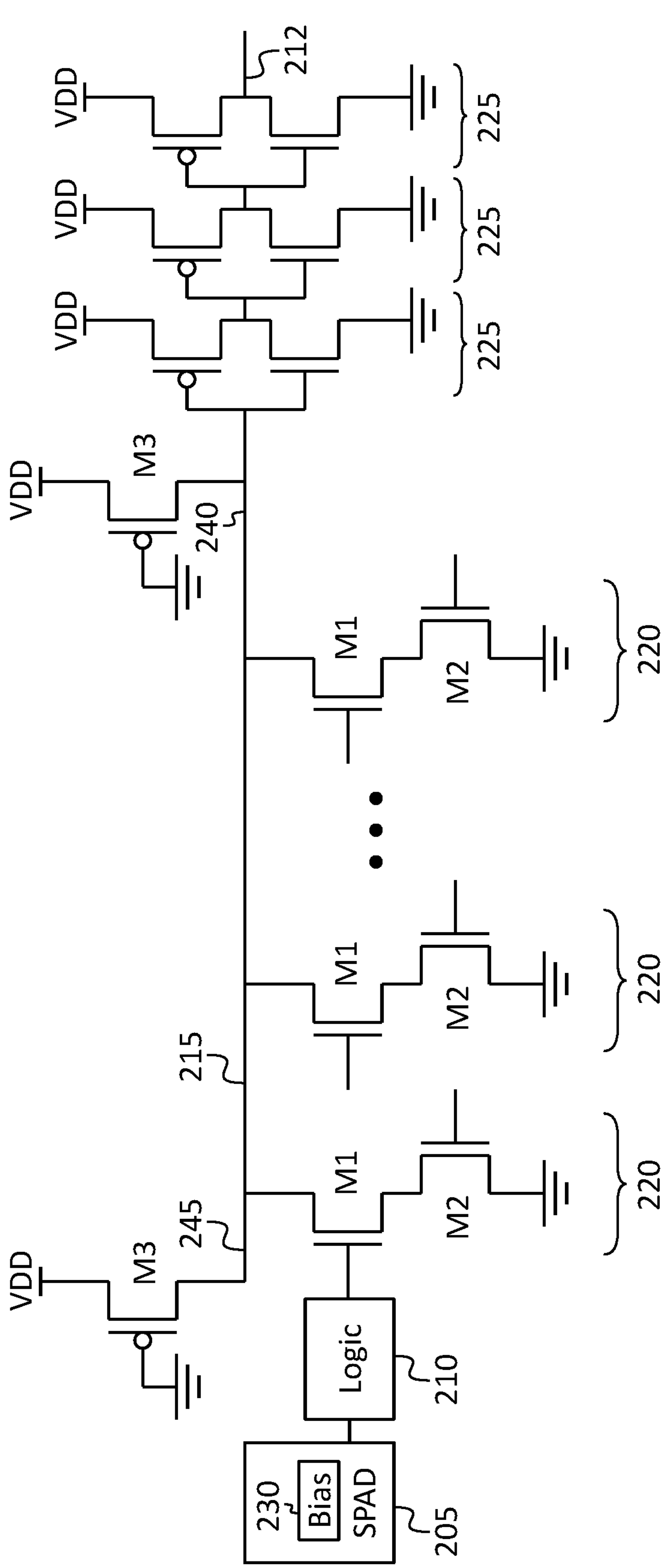
FIG. 2E is a diagram of a portion of a single-photon avalanche diode array detector, according to an embodiment of the present disclosure.

Referring to FIG. 2E, in some embodiments, the row-select transistor M2 is between ground and the pull-down transistor M1, as shown. In some embodiments one or more of the pull-up elements is a different element, e.g., a resistor. In some embodiments, the pull-up transistor or transistors M3 and the buffer amplifier are on the periphery of the single-photon avalanche diode array; in such an embodiment the size of each pixel (and the pixel pitch) of the single-photon avalanche diode array may be unaffected by the presence of the pull-up transistor or transistors M3 and the buffer amplifier.

The circuits of FIG. 2A-2E may include a bias circuit 230 (FIG. 2E) for biasing the single-photon avalanche diode. This circuit may produce a relatively high bias voltage, e.g., 2.8 V, and, accordingly, the output of the single-photon avalanche diode 205 and of the logic circuit 210 may range between 0 V and 2.8 V. This voltage range may, however, be confined to the single-photon avalanche diode 205, the logic circuit 210, and the gate of the pull-down transistor M1. As such, the voltage on the bus line 215 may range only between ground and VDD (e.g., 1.2 V) and it may not be necessary for the circuit to include a level shifter.

In some embodiments, sets of adjacent pixels may be grouped together so they share a pull-down circuit 220. For example, the outputs of the logic circuits 210 of a plurality of (e.g., four) adjacent pixels may be connected to the input of a four-input NAND gate, the four-input NAND gate having four inverting inputs. The output of the four-input NAND gate may be connected to the pull-down transistor M1. In such an embodiment, when an (active low) pulse is produced by any one of the four single-photon avalanche diodes, the output of the four-input NAND gate will temporarily go high, and M1 will be turned on, pulling the bus line 215 low.

Figure 3A:
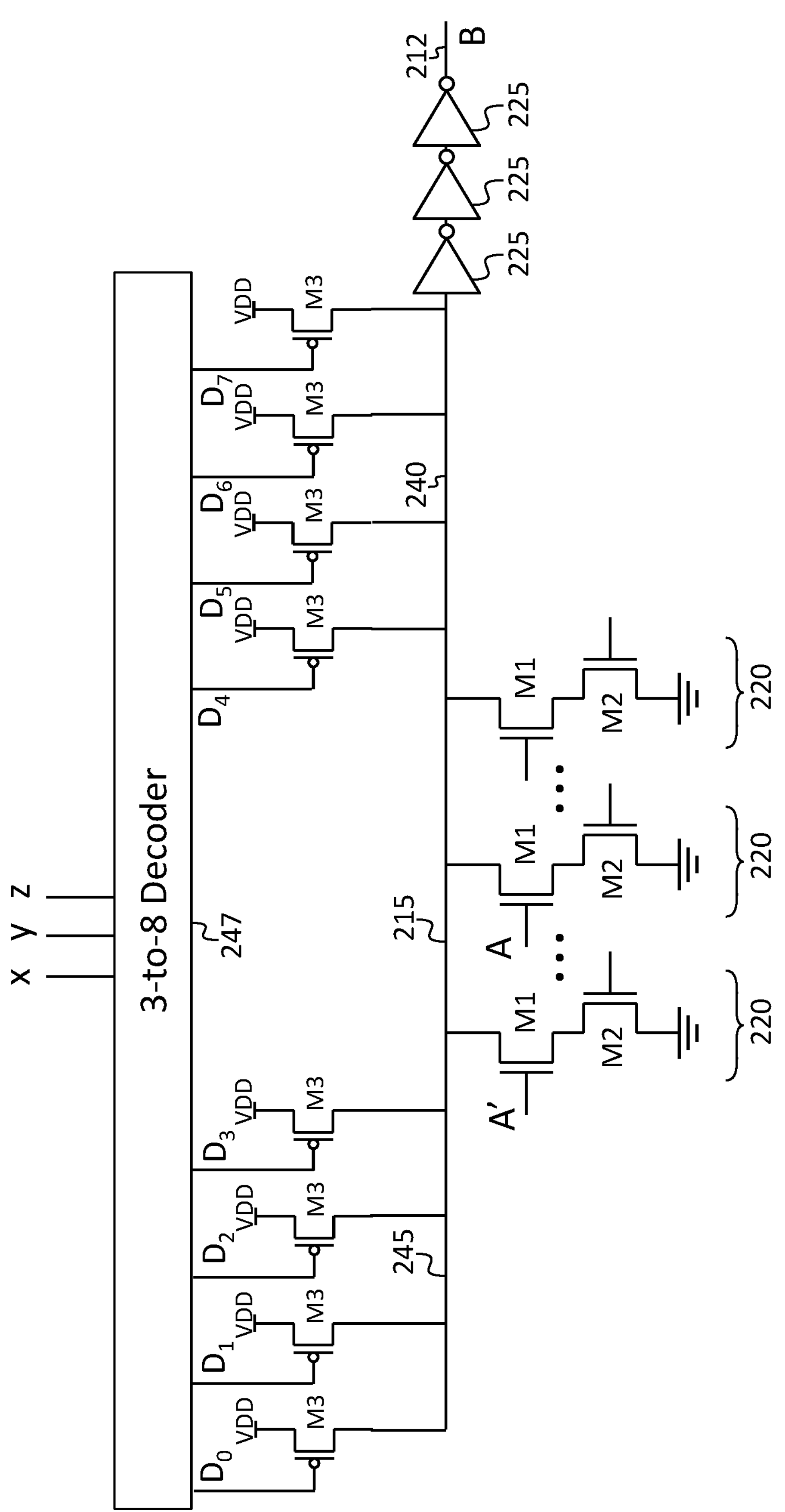
FIG. 3A is a diagram of a portion of a single-photon avalanche diode array detector, according to an embodiment of the present disclosure.

Referring to FIG. 3A, in some embodiments, a first plurality of pull-up transistors M3 are connected to the downstream end 240 of the bus line 215 and a second plurality of pull-up transistors M3 are connected to the upstream end 245 of the bus line 215. These pull-up transistors may be turned on or off by a suitable control signal (e.g., by an 8-bit control signal including bits labeled $D_0$ through $D_7$, with bits $D_0$ through $D_3$ controlling the pull-up transistors M3 near the upstream end 245 of the bus line 215 and bits $D_4$ through $D_7$ controlling the pull-up transistors M3 near the downstream end 240 of the bus line 215), according to the location of the pixel being read out. A bit value of zero may turn the corresponding pull-up transistor M3 on and a bit value of one may turn it off. In the embodiment of FIG. 3A, each of the pull-down transistors M1 is between a row-select transistor M2 and the bus line 215 (as in the embodiment of FIG. 2E); in other embodiments otherwise analogous to FIG. 3A, each of the row-select transistors M2 is between a respective pull-down transistor M1 and the bus line 215 (as in the embodiment of FIG. 2D). The control signal may be generated by a decoder 247 based on an input signal having fewer bits (e.g., an 8-bit control signal may be generated by a 3-bit input signal, as illustrated in FIG. 3A).

For example, if a pixel near the upstream end 245 of the bus line 215 is being read out, then the pull-up transistors M3 near the upstream end 245 of the bus line 215 may be turned on, and the pull-up transistors M3 near the downstream end 240 of the bus line 215 may be turned off. Similarly, if a pixel near the downstream end 240 of the bus line 215 is being read out, then the pull-up transistors M3 near the upstream end 245 of the bus line 215 may be turned off, and the pull-up transistors M3 near the downstream end 240 of the bus line 215 may be turned on. This manner of controlling the pull-up transistors M3, which may be referred to as "delay compensation" may result in more uniform signal rising edge delay for pixels at different locations along the bus line 215.

When a pixel that is not at either end of the bus line 215 is read out, some of the pull-up transistors M3 near the upstream end 245 of the bus line 215 may be turned on, and some of the pull-up transistors M3 near the downstream end 240 of the bus line 215 may be turned on. This is illustrated in FIG. 3C, which shows, for example (in the row labeled "Center"), that for a pixel at the center of the bus line 215, two of the pull-up transistors M3 near the upstream end 245 of the bus line 215 are turned on, and two of the pull-up transistors M3 near the downstream end 240 of the bus line 215 are turned on. FIG. 3C also shows (i) (in the row labeled "Left") that for a pixel to the left of (i.e., near the upstream end 245 of) the center of the bus line 215, three of the pull-up transistors M3 near the upstream end 245 of the bus line 215 are turned on, and one of the pull-up transistors M3 near the downstream end 240 of the bus line 215 is turned on, and (ii)

Figure 3D:
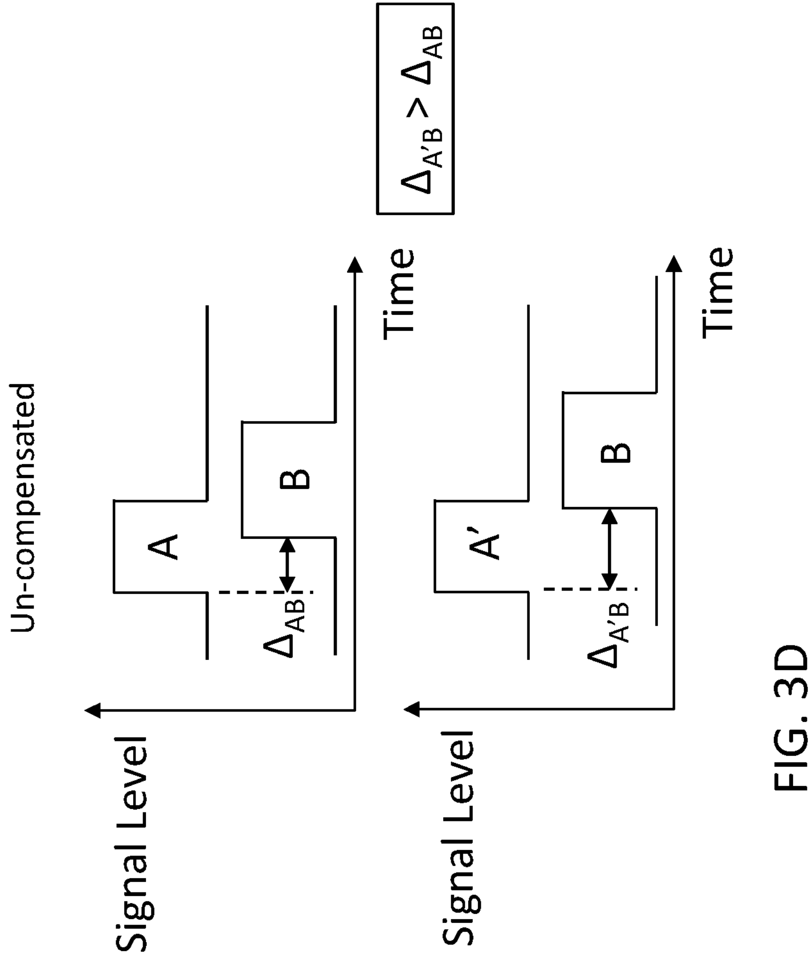
FIG. 3D is a timing diagram, according to an embodiment of the present disclosure.
Figure 3E:
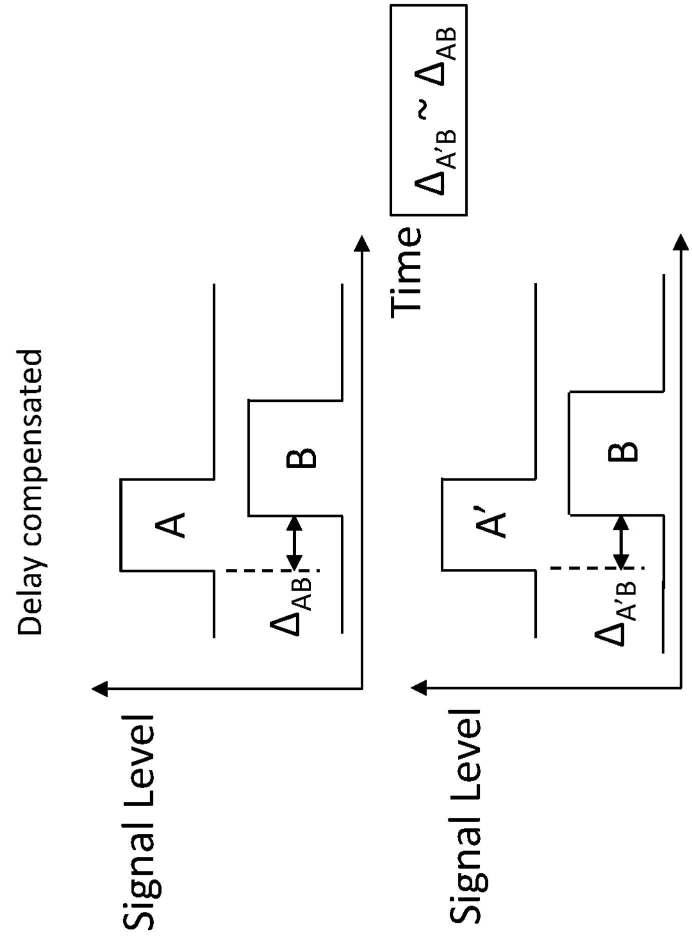
FIG. 3E is a timing diagram, according to an embodiment of the present disclosure.

(in the row labeled "Right") that for a pixel to the right of (i.e., near the downstream end 240 of) the center of the bus line 215, one of the pull-up transistors M3 near the upstream end 245 of the bus line 215 is turned on, and three of the pull-up transistors M3 near the downstream end 240 of the bus line 215 are turned on. FIG. 3B shows, for comparison, the set of control signals that may be used if delay compensation is disabled. FIGS. 3D and 3E (which show waveforms at the points A, A', and B in FIG. 3A) are timing diagrams illustrating, qualitatively, the effect of delay compensation on the rising edge delay experienced by pulses from different ends of the bus line 215.

Figure 4:
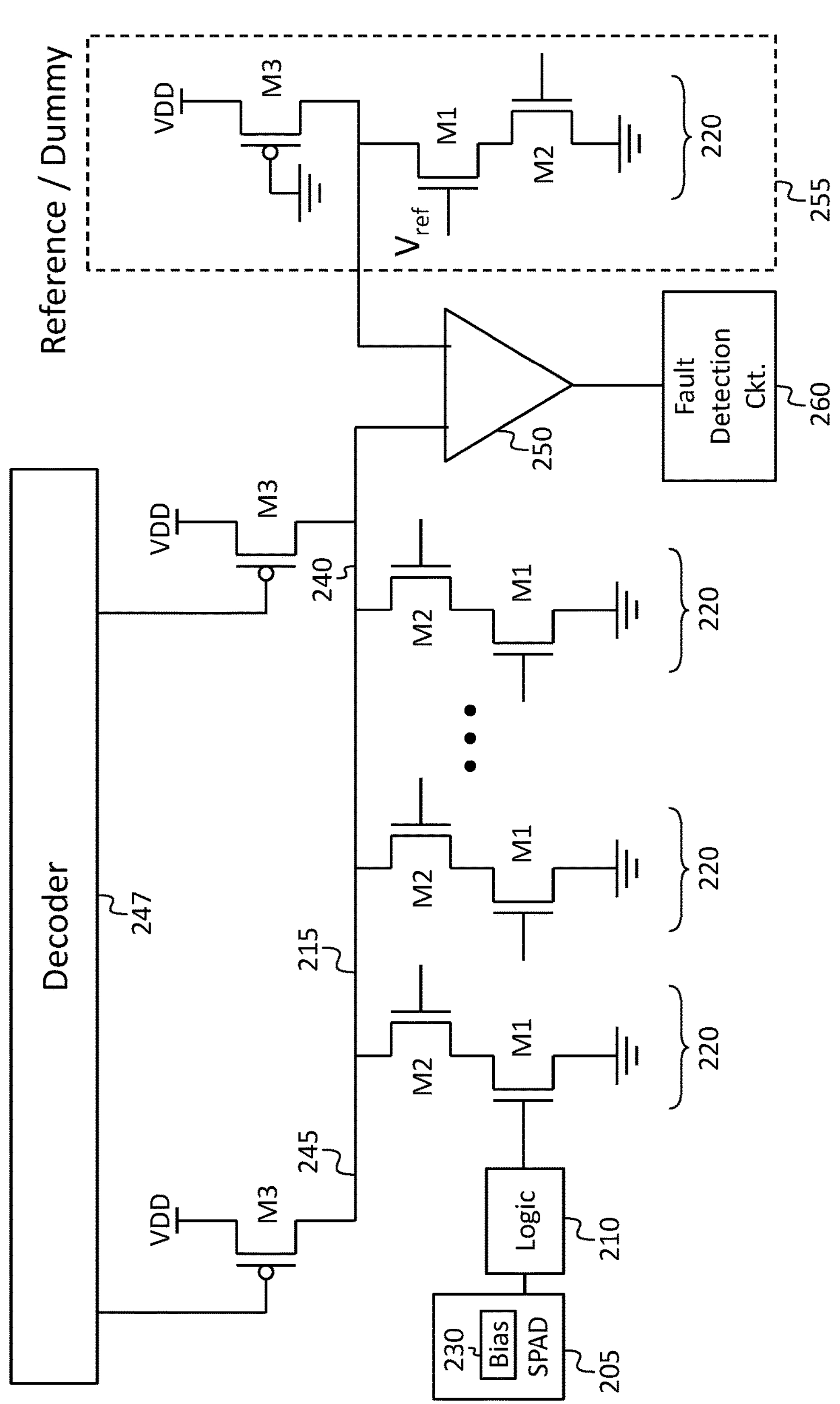
FIG. 4 is a diagram of a portion of a single-photon avalanche diode array detector, according to an embodiment of the present disclosure.

In some embodiments, a pixel surveying circuit for detecting faulty pixels, as illustrated in FIG. 4, is employed. A test is run while the detector is dark (e.g., with a mechanical shutter closed, or in a test fixture used during manufacturing) and each pixel is read out. During the test, the comparator 250 compares the current drawn by each pixel to the current drawn by a dummy pixel reference circuit 255 (which draws a current approximately equal to the current drawn by a properly functioning pixel when dark) and a fault detection circuit 260 detects pixels that are faulty (e.g., "hot" pixels that are drawing excessive current when dark). A control circuit (e.g., a processing circuit connected to the fault detection circuit 260), which may be configured to generate the control signal (e.g., the 8-bit control signal) for controlling the pull-up transistors M3, may then, after the test is completed, disable all of the pull-up transistors M3, to save power, whenever a faulty pixel is being read out. The processing circuit may include a suitable stage machine (e.g., a microprocessor or a microcontroller) for generating the 3-bit input signal, and the 3-to-8 decoder 247.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, the term "or" should be interpreted as "and/or", such that, for example, "A or B" means any one of "A" or "B" or "A and B".

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

Each of the terms "processing circuit" and "means for processing" is used herein to mean any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general-purpose hardware, such as a CPU, configured to execute instructions stored in a non-transitory storage medium. A processing circuit may be fabricated on a single printed circuit board (PCB) or distributed over several interconnected PCBs. A processing circuit may contain other processing circuits; for example, a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

It will be understood that when an element is referred to as being "directly connected" or "directly coupled" to another element, there are no intervening elements present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Although exemplary embodiments of an output circuit for a single-photon avalanche diode in an array of single-photon avalanche diodes have been specifically described and illustrated herein, many modifications and variations will be apparent to those skilled in the art. Accordingly, it is to be understood that an output circuit for a single-photon avalanche diode in an array of single-photon avalanche diodes constructed according to principles of this disclosure may be embodied other than as specifically described herein. The invention is also defined in the following claims, and equivalents thereof.

What is claimed is:

1. A system, comprising:

a first sensing element;

a bus line;

a first pull-down circuit;

a first pull-up element; and a second pull-up element, the first pull-up element, the second pull-up element, and the first pull-down circuit being connected to the bus line, the first pull-down circuit being connected to the first sensing element and configured to be activated based on a signal from the first sensing element, the first pull-up element having a lower drive strength than the first pull-down circuit.

2. The system of claim 1, wherein the first sensing element is a single-photon avalanche diode.

3. The system of claim 1, comprising:

a plurality of sensing elements including the first sensing element; and a plurality of pull-down circuits including the first pull-down circuit, each of the pull-down circuits being connected to the bus line, each of the pull-down circuits being connected to, and configured to be activated based on a signal from, a respective sensing element of the plurality of sensing elements, wherein the sensing elements and the pull-down circuits share the bus line and the first pull-up element.

4. The system of claim 1, wherein first the first pull-down circuit comprises a pull-down transistor.

5. The system of claim 4, wherein the first pull-down circuit further comprises a row-select transistor.

6. The system of claim 5, wherein the row-select transistor is connected between the pull-down transistor and the bus line.

7. The system of claim 1, wherein the first pull-up element and the second pull-up element together have a lower drive strength than the first pull-down circuit.

8. The system of claim 7, wherein:

the first pull-up element has a drive strength less than one-half of a drive strength of the first pull-down circuit, and the second pull-up element has a drive strength less than one-half of a drive strength of the first pull-down circuit.

9. The system of claim 1, further comprising a buffer amplifier connected to the bus line.

10. The system of claim 9, wherein the buffer amplifier is connected to and end of the bus line.

11. The system of claim 9, wherein the buffer amplifier comprises a complementary metal oxide semiconductor (CMOS) inverter.

12. The system of claim 11, wherein the buffer amplifier comprises three CMOS inverters.

13. The system of claim 1, further comprising a bias circuit for applying a bias voltage to the first sensing element, the magnitude of the bias voltage being greater than 2.0 V.

14. The system of claim 13, wherein the magnitude of a voltage drop across the first pull-up element, when the bus line is pulled down by the first pull-down circuit, is less than 1.5 V.

15. The system of claim 1, wherein the first pull-up element comprises a transistor having a gate connected to a fixed voltage.

16. The system of claim 1, comprising:

a plurality of pull-up elements including the first pull-up element and the second pull-up element, and a processing circuit, configured to turn on or off each of the pull-up elements according to a location of a pixel being read out.

17. The system of claim 1, comprising:

a plurality of pull-up elements including the first pull-up element and the second pull-up element; and a pixel surveying circuit configured to detect faulty pixels, and to turn off the pull-up elements when a faulty pixel is being read out.

18. A system, comprising:

a means for sensing;

a bus line;

a first pull-down circuit;

a first pull-up element; and a second pull-up element, the first pull-up element, the second pull-up element, and the first pull-down circuit being connected to the bus line, the first pull-down circuit being connected to the means for sensing and configured to be activated based on a signal from the means for sensing, the first pull-up element having a lower drive strength than the first pull-down circuit.

* * * * *